United States Patent
Agarwal et al.

(10) Patent No.: US 6,821,838 B2
(45) Date of Patent: Nov. 23, 2004

(54) METHOD OF FORMING AN ULTRA THIN DIELECTRIC FILM AND A SEMICONDUCTOR DEVICE INCORPORATING THE SAME

(75) Inventors: Vishnu Agarwal, Boise, ID (US); Garry Anthony Mercaldi, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 10/273,666

(22) Filed: Oct. 18, 2002

(65) Prior Publication Data

US 2003/0030082 A1 Feb. 13, 2003

Related U.S. Application Data

(62) Division of application No. 09/653,298, filed on Aug. 31, 2000, now Pat. No. 6,521,544.

(51) Int. Cl.[7] ............................................. H01L 21/00
(52) U.S. Cl. ...................................... 438/240; 438/769
(58) Field of Search ................................ 438/240, 769, 438/287

(56) References Cited

U.S. PATENT DOCUMENTS

| | | |
|---|---|---|
| 5,290,736 A | 3/1994 | Sato et al. |
| 5,304,398 A | 4/1994 | Krusell et al. |
| 5,312,776 A | 5/1994 | Murakami et al. |
| 5,358,739 A | 10/1994 | Baney et al. |
| 5,525,551 A | 6/1996 | Ohta |
| 5,814,852 A | 9/1998 | Sandhu et al. |
| 5,844,771 A | 12/1998 | Graettinger et al. |
| 5,872,696 A | 2/1999 | Peters et al. |
| 5,874,766 A | 2/1999 | Hori |
| 5,882,978 A | 3/1999 | Srinivasan et al. |
| 6,171,978 B1 * | 1/2001 | Lin et al. ................. 438/775 |
| 6,291,288 B1 | 9/2001 | Huang et al. |
| 6,521,544 B1 * | 2/2003 | Agarwal et al. .......... 438/763 |

* cited by examiner

*Primary Examiner*—Richard A. Booth
(74) *Attorney, Agent, or Firm*—Dinsmore & Shohl LLP

(57) ABSTRACT

A method of forming an ultra thin dielectric film or dielectric layer on a semiconductor device is disclosed. In one embodiment of the present invention, an oxide layer is formed over a substrate. A silicon-containing material is deposited over the oxide layer. The deposited material and oxide layer are processed in a plasma to form the dielectric layer or ultra thin dielectric film. The silicon-containing dielectric layer can allow for improved or smaller semiconductor devices. The silicon containing dielectric layer can be fabricated at low temperatures. Improved or smaller semiconductor devices may be accomplished by reducing leakage, increasing the dielectric constant or fabricating at lower temperatures.

15 Claims, 3 Drawing Sheets

METHOD OF FORMING AN ULTRA THIN DIELECTRIC FILM AND A SEMICONDUCTOR DEVICE INCORPORATING THE SAME

CROSS-REFERENCES TO RELATED APPLICATIONS

This application is a division of U.S. patent application Ser. No. 09/653,298 filed Aug. 31, 2000, now U.S. Pat. No. 6,521,544.

This application is related to commonly assigned U.S. patent application Ser. No. 09/653,639, METHOD FOR FORMING A BARRIER LAYER AND A SEMICONDUCTOR DEVICE INCORPORATING THE SAME, filed Aug. 31, 2000, by Powell et al. and Ser. No. 09/653,096, METHOD FOR FORMING A DIELECTRIC LAYER AND A SEMICONDUCTOR DEVICE INCORPORATING THE SAME, filed Aug. 31, 2000, by Powell et al., the disclosure of which are incorporated herein by reference.

FIELD OF THE INVENTION

The present invention relates to the field of semiconductors and, more particularly, to forming a dielectric layer at a low temperature.

BACKGROUND OF THE INVENTION

There is an increasing demand for semiconductor devices of reduced size. The performance characteristics of semiconductor devices become more important as device size decreases. Accordingly, processes that enhance performance characteristics are important to improved semiconductor fabrication. For example, capacitor performance can be improved by improving the dielectric constant of the capacitor's dielectric layer and reducing leakage across the dielectric layer.

Ultra thin dielectric films can greatly affect the performance of semiconductor devices. Ultra thin films are normally used as dielectric layers in semiconductor devices. Conventional ultra thin films and dielectric fabrication methods require high temperatures and are often inadequate to allow significant reduction of semiconductor device size.

Accordingly, there is a need in the art for an improved method of forming a dielectric layer or ultra thin dielectric film.

SUMMARY OF THE INVENTION

This need is met by the present invention wherein a method of forming an ultra thin dielectric film or dielectric layer on a semiconductor device is disclosed. According to one embodiment of the present invention, a semiconductor device is provided. An oxide layer is formed over the semiconductor device. A silicon-containing material is deposited over at least a portion of the oxide layer. The oxide layer and deposited silicon-containing material are converted to the ultra thin dielectric film by processing the deposited silicon-containing material and the oxide layer in a high density plasma.

According to another embodiment of the present invention, a method of forming a dielectric layer on a semiconductor device is disclosed. A semiconductor device having an oxide layer is provided. A silicon-containing material is vapor deposited over at least a portion of the semiconductor device. The deposited silicon-containing material and the oxide layer are converted into the dielectric layer by utilizing a high density plasma.

According to another embodiment of the present invention a semiconductor device is disclosed. The semiconductor device includes a substrate and a dielectric layer. The dielectric layer is formed over the substrate by converting vapor deposited silicon-containing material and a thin oxide layer using a high density plasma.

Other methods and devices are disclosed.

BRIEF DESCRIPTION OF THE SEVERAL VIEWS OF THE DRAWINGS

The following detailed description of the present invention can be best understood when read in conjunction with the accompanying drawings, where like structure is indicated with like reference numerals.

DETAILED DESCRIPTION OF THE INVENTION

Figure 1:
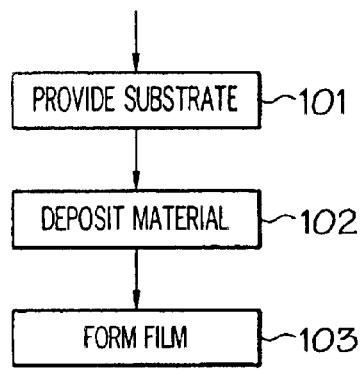
FIG. 1 illustrates a method for forming a dielectric layer according to one embodiment of the present invention.

FIG. 1 illustrates a method for forming a dielectric layer or ultra thin dielectric film according to one embodiment of the present invention. A substrate is provided at block 101. The substrate may comprise one or more semiconductor layers or semiconductor structures which may define portions of a semiconductor device. A semiconductor device may comprise a transistor, capacitor, electrode, insulator or any of a variety of components commonly utilized in semiconductor structures. A silicon-containing material is vapor deposited over the substrate from a silicon source at block 102. As is noted below, the silicon-containing material can be from a silazane or silane source such as hexamethyldisilazane (HMDS).

The dielectric layer or ultra thin dielectric film is formed by subjecting the deposited silicon-containing material to a high density plasma at a low temperature at block 103. For the present invention, a low temperature is defined as a temperature less than 300° C. A ""high density plasma"" is a plasma containing a higher density of ions in comparison to a normal plasma. Normal plasma has an ion concentration in the range of $10^9$ ions/cm$^3$ whereas high density plasma generally has a ion concentration of $10^{11}$ to $10^{12}$ ions/cm$^3$ (1000 times higher compared to normal plasma). Silicon atoms of the deposited material react with ions of the high density plasma. The high density plasma contains $H_2$, $NH_3$, $N_2$, $O_2$, $O_3$, $N_2O$ or NO which are converted to ions or activated species by the high density-plasma.

During the process of subjecting the deposited silicon-containing material to a high density plasma, the plasma can be remote or in contact with the wafer. The resulting film can be a nitride, oxynitride or oxide film with specific electrical properties, depending on the type of high density plasma used. Some examples of silicon-containing sources which may be used are hexamethyldisilazane (HMDS), tetramethyldisilazane, octamethylcyclotetrasilazine, hexamethylcyclotrisilazine, diethylaminotrimethylsilane and dimethylaminotrimethylsilane, however other silicon-containing sources may be used.

According to the remote plasma process of the present invention, the plasma is generated with microwaves or another form of conventional plasma generating energy. Specifically, a wafer or substrate is placed in a chamber. Gases such as $H_2$, $NH_3$, $N_2$, $O_2$, $O_3$, $N_2O$ and NO are exposed to plasma generated outside of the chamber to create the activated species, such as $H_2$, $NH_3$, $N_2$, $O_2$, $O_3$, $N_2O$ or NO ions. The plasma does not come into physical contact with the wafer or surface of the substrate which, in this case, is the silicon-containing material. The activated species are subsequently pumped into the chamber. This can reduce or prevent damage to the substrate or device.

Suitable remote plasma process parameters for a microwave plasma source include a power source of 500 W to 5 KW, a gas flow rate of 0–5000 cm$^3$/min and a pressure of 100 mT to 50T.

The contact plasma process is also referred to as a direct plasma process. The wafer containing the semiconductor device is placed in a chamber and the high density plasma is generated in the chamber, creating activated species. The plasma comes into direct contact with the wafer. Exemplary parameters include a power source of 100 W to 4 kW, gas flow rate of 0–5000 cm$^3$/min and a chamber pressure of 500 mT to 5T.

Figure 2A:
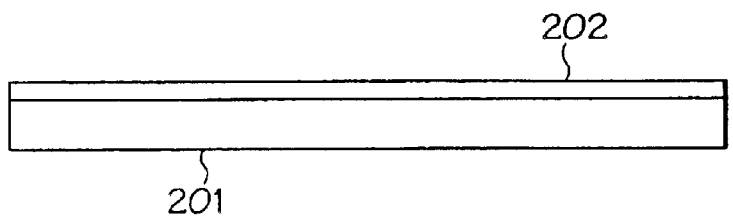
FIGS. 2A, 2B and 2C illustrate a semiconductor device with a nitrided gate and its method of fabrication according to another embodiment of the present invention.
Figure 2B:
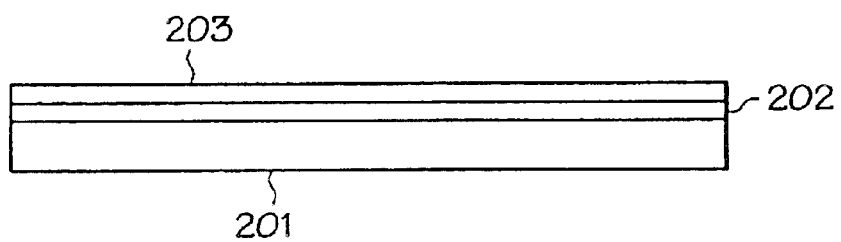
Figure 2C:
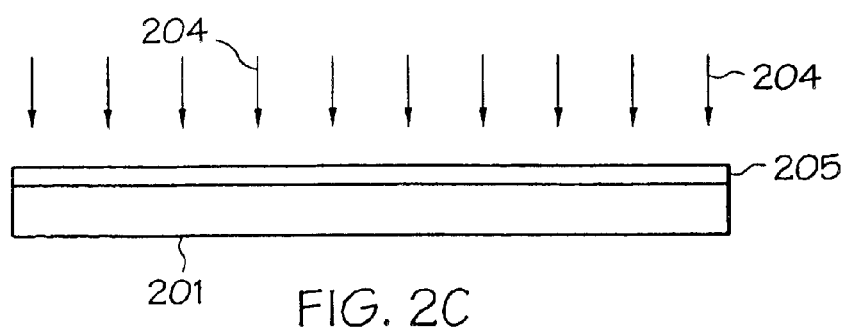

FIGS. 2A, 2B and 2C illustrate a semiconductor device with a nitrided gate according to another embodiment of the present invention. FIG. 2A shows the semiconductor device having a substrate 201 and a gate oxide 202 prior to depositing a silicon-containing material from a silicon source such as HMDS. The substrate 201 is of a semiconductor material such as, but not limited to silicon. The gate oxide 202 is formed over the substrate 201. FIG. 2B shows the semiconductor device having the substrate 201, the gate oxide 202 and a silicon containing material 203, after depositing the the silicon containing material 203. The silicon containing material 203 has been vapor deposited over the gate oxide 202. FIG. 2C shows the semiconductor device after the silicon containing material 203 has been subjected to high density plasma (HDP) 204 and includes the substrate 201 and an oxynitrided gate 205. The silicon containing material 203 can be subjected to the HDP remotely or directly. The gate oxide 202 and the silicon containing material 203 have been converted into the oxynitrided gate 205 by the HDP 204. The HDP 204 can include any activated species of plasma that converts the silicon containing material 203 and gate oxide 202 into the oxynitrided gate 205. Some examples of precursors used in such plasmas for nitridation are $NH_3$, $N_2$, and $N_2+H_2$. The oxynitrided gate 205 has a thickness of less than 30 Å and is comprised of $Si_3N_4$ or $SiO_xN_y$.

Figure 3A:
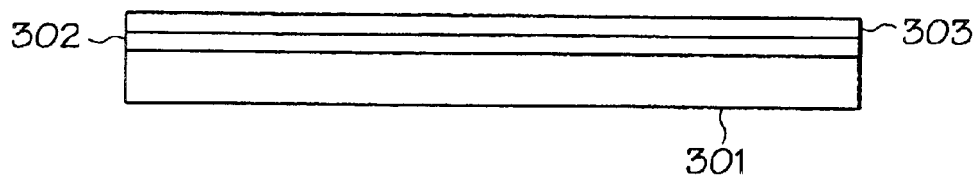
FIGS. 3A, 3B and 3C illustrate a semiconductor device and its method of fabrication according to another embodiment of the present invention.
Figure 3B:
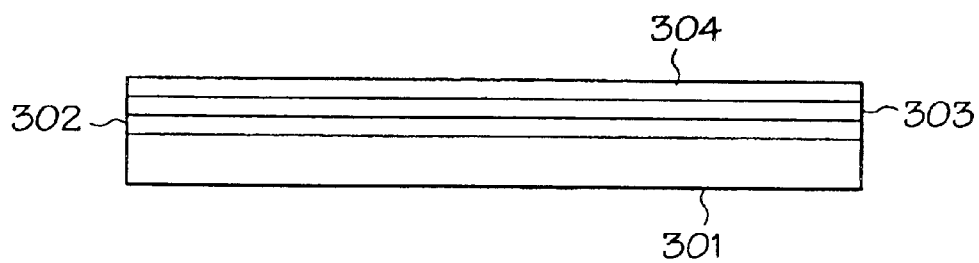
Figure 3C:
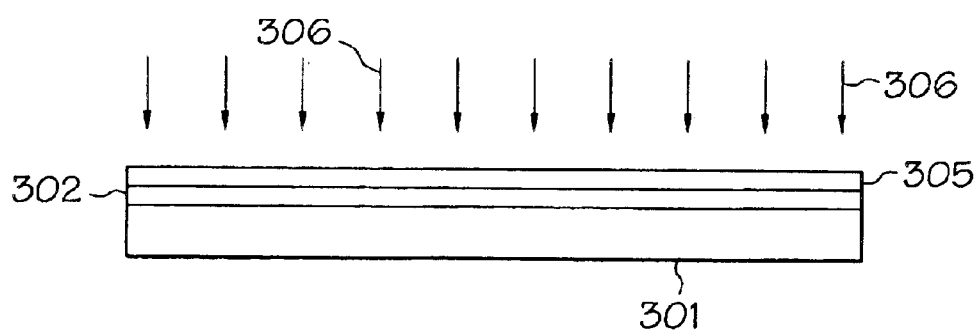

FIGS. 3A, 3B and 3C illustrate a semiconductor device according to another embodiment of the present invention. FIG. 3A shows the semiconductor device having a substrate 301, a lower electrode 302 and a native oxide 303 prior to depositing a silicon layer 304. The substrate 301 is of a semiconductor material such as, but not limited to silicon. The lower electrode 302 is formed over the substrate 301. Typically, the native oxide 303 is formed over the lower electrode 302. The native oxide 303 naturally occurs on the lower electrode 302. In other embodiments, an oxide layer can be grown or deposited instead of using a native oxide layer. FIG. 3B shows the semiconductor device having the substrate 301, the lower electrode 302, the native oxide 303 and a silicon layer 304. The silicon layer 304 is typically vapor deposited over the native oxide 303 from a silicon source such as HMDS. FIG. 3C shows the semiconductor device after the silicon layer 304 has been subjected to HDP 306 and includes the substrate 301, the lower electrode 302 and a dielectric layer 305. The silicon layer 304 can be subjected to the HDP 306 remotely or directly. The native oxide 303 and the silicon layer 304 are converted into the oxynitrided gate 305 by the HDP 306 by causing silicon atoms of the silicon layer 304 to react with the native oxide and ions in the HDP 306. The HDP 306 can include any activated species of plasma that converts the silicon layer 304 and gate oxide 303 into the dielectric layer 305. Some examples of such plasmas are $NH_3$, $N_2$, and $N_2+H_2$. The dielectric layer 305 has a thickness of less than 30 Å.

Figure 4A:
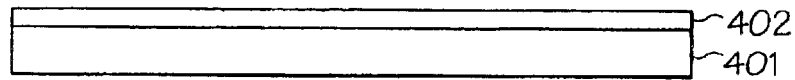
FIGS. 4A, 4B and 4C illustrate a semiconductor device and its method of fabrication according to another embodiment of the present invention.
Figure 4B:
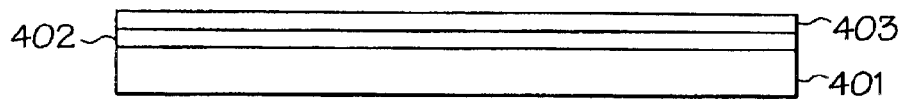
Figure 4C:
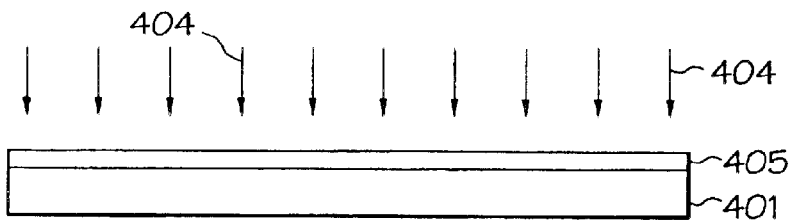

FIGS. 4A, 4B and 4C illustrate a semiconductor device according to another embodiment of the present invention. FIG. 4A shows the semiconductor device having a substrate 401 and an oxide 402 prior to depositing a silicon-containing layer. The substrate 401 is of a semiconductor material such as, but not limited to silicon. The oxide 402 is formed over the substrate 401. FIG. 4B shows the semiconductor device having the substrate 401, the oxide 402 and a silicon-containing layer 403, after depositing the silicon-containing layer 403. The silicon-containing layer 403 is typically vapor deposited over the oxide 402. FIG. 4C shows the semiconductor device after the silicon containing layer 403 has been subjected to HDP 404 and includes the substrate 401 and a dielectric layer 405. The semiconductor device can be subjected to the HDP remotely or directly. The oxide 402 and silicon-containing layer 403 are converted into the dielectric layer 405 by the plasma 404. The plasma 404 can include any activated species of plasma that converts the silicon-containing layer 403 and oxide 402 into the dielectric layer 405. Some examples of such plasmas are $NH_3$, $N_2$, and $N_2+H_2$. The dielectric layer 405 can have a thickness of less than 30 Å.

Figure 5:
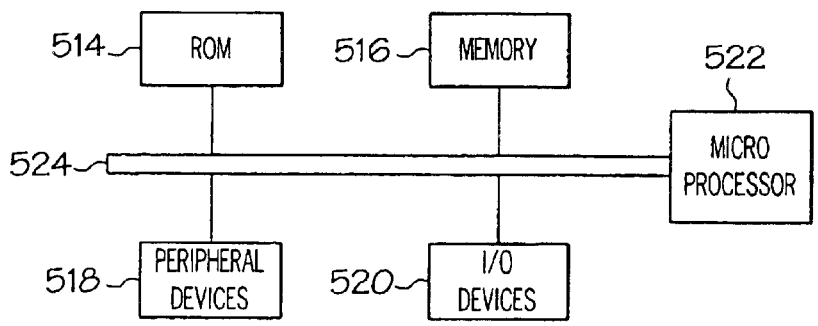
FIG. 5 illustrates a computer system that can use and be used with embodiments of the present invention.

FIG. 5 is an illustration of a computer system 512 that can use and be used with embodiments of the present invention. As will be appreciated by those skilled in the art, the computer system 512 would include ROM 514, mass memory 516, peripheral devices 518, and I/O devices 520 in communication with a microprocessor 522 via a data bus 524 or another suitable data communication path. These devices can be fabricated according to the various embodiments of the present invention. For example, mass memory 516 can comprise memory cells having at least one ultra thin dielectric film formed according to one embodiment of the invention.

Dielectric layers or ultra thin dielectric films fabricated using the present invention can be used for a variety of purposes. Some examples follow, but embodiments of the present invention are not limited to these. A dielectric layer can be used as a cell dielectric material. A dielectric layer can be used as a single dielectric in a capacitor, transistor or anti-fuse application. A dielectric layer can be used to form composite dielectric in a multi dielectric stack type spacer, capacitor, transistor or anti-fuse application. A dielectric layer can be used to form a continuous low temperature barrier layer. A dielectric layer can be used for low temperature conditioning for advanced dielectrics such as $Ta_2O_5$ and BST. A dielectric layer can be used for a low temperature post metal barrier layer or interconnect conditioning to reduce oxidation.

For the purposes of describing and defining the present invention, formation of a material "on" a substrate or layer refers to formation in contact with a surface of the substrate or layer. Formation "over" a substrate or layer refers to formation above or in contact with a surface of the substrate. Formation "in" a substrate or layer refers to formation of at least a portion of a structure in the interior of a substrate layer. An "ultra-thin film" is a dielectric layer with a thickness not greater than 10 microns and uniformity within 20% of its average value.

Having described the present invention in detail and by reference to preferred embodiments thereof, it will be apparent that modifications and variations are possible without departing from the scope of the present invention defined in the appended claims.

What is claimed is:

1. A method of fabricating a semiconductor device comprising:

providing a substrate having at least one semiconductor layer;

depositing a thin gate oxide layer over at least a portion of the substrate;

vapor depositing silicon from hexamethyldisilazane over the thin gate oxide layer; and subjecting the deposited silicon and the thin gate oxide layer to activated species from a remote high density plasma source so as to convert the deposited silicon and the thin gate oxide layer into an oxynitride layer.

2. The method of claim 1 further comprising: forming a gate electrode over the oxynitride layer.

3. The method of claim 2 further comprising: doping the gate electrode with phosphor.

4. The method of claim 2 further comprising: doping the gate electrode with boron or arsenic.

5. The method of claim 1 wherein the high density plasma contains at least one material selected from the group comprising $NH_3$, $N_2$, $O_2$, $N_2O$, and NO.

6. A method for fabricating a semiconductor device comprising:

providing a substrate having at least one semiconductor layer;

forming a lower electrode over the substrate;

forming a native oxide over the lower electrode; and depositing a silicon-containing material over at least a portion of the native oxide; and converting the native oxide and the silicon-containing material into an oxynitride by flowing $NH_3$ in a high density plasma.

7. A method for fabricating a semiconductor device comprising:

providing a substrate having at least one semiconductor layer;

forming a lower electrode over at least a portion of the substrate and thereby forming a native oxide over the lower electrode;

depositing a silicon-containing material over the native oxide; and converting the native oxide and the silicon-containing material onto an oxynitride by flowing $N_2+H_2$ in a high density plasma.

8. The method of claim 6 wherein said silicon-containing material is selected from the group consisting of hexamethyldisilazane, tetramethyldisilazane, octamethylcyclotetrasilazane, hexamethylcyclotrisilazane, diethylaminotrimethylsilane, and dimethylaminotrimethylsilane.

9. The method of claim 6 wherein said silicon-containing material comprises hexamethyldisilazane.

10. The method of claim 6 wherein said silicon-containing material comprises tetramethyldisilazane.

11. The method of claim 6 wherein said silicon-containing material comprises octamethylcyclotetrasilazane.

12. The method of claim 7 wherein said silicon-containing material is selected from the group consisting of hexamethyldisilazane, tetramethyldisilazane, octamethylcyclotetrasilazane, hexamethylcyclotrisilazane, diethylaminotrimethylsilane, and dimethylaminotrimethylsilane.

13. The method of claim 7 wherein said silicon-containing material comprises hexamethyldisilazane.

14. The method of claim 7 wherein said silicon-containing material comprises tetramethyldisilazane.

15. The method of claim 7 wherein said silicon-containing material comprises octamethylcyclotetrasilazane.

* * * * *